(12) United States Patent
Teetzel

(10) Patent No.: US 8,269,543 B2
(45) Date of Patent: Sep. 18, 2012

(54) AUTOMATIC RC/CR QUADRATURE NETWORK

(76) Inventor: Andrew M. Teetzel, Wilson, WY (US)

( * ) Notice: Subject to any disclaimer, the term of this patent is extended or adjusted under 35 U.S.C. 154(b) by 411 days.

(21) Appl. No.: 12/446,743

(22) PCT Filed: Oct. 23, 2007

(86) PCT No.: PCT/US2007/082294
§ 371 (c)(1),
(2), (4) Date: Apr. 22, 2009

(87) PCT Pub. No.: WO2008/052008
PCT Pub. Date: May 2, 2008

(65) Prior Publication Data
US 2010/0090740 A1    Apr. 15, 2010

(51) Int. Cl.
*H03H 11/16* (2006.01)
(52) U.S. Cl. .................. 327/254; 327/233; 327/237
(58) Field of Classification Search .................. 327/231, 327/233, 234, 237, 238, 243, 244, 247, 250, 327/251, 254, 255, 258
See application file for complete search history.

(56) References Cited

U.S. PATENT DOCUMENTS

| | | | | |
|---|---|---|---|---|
| 4,628,272 A | * | 12/1986 | Davis et al. | 329/336 |
| 5,644,260 A | * | 7/1997 | DaSilva et al. | 327/238 |
| 5,694,093 A | | 12/1997 | DaSilva | |
| 6,275,685 B1 | * | 8/2001 | Wessel et al. | 455/126 |
| 6,310,502 B1 | * | 10/2001 | Klier | 327/231 |
| 6,658,066 B1 | | 12/2003 | Magoon et al. | |

* cited by examiner

*Primary Examiner* — Long Nguyen
(74) *Attorney, Agent, or Firm* — Craig M. Stainbrook; Stainbrook & Stainbrook, LLP

(57) ABSTRACT

A stabilized quadrature RC/CR phase shifting network for generating quadrature RF and microwave signals. The network uses offset biasing of postamplifiers following the phaseshifter to fine tune quadrature-phase, and further uses an output quadrature-phase detector to stabilize quadrature-phase with negative feedback by using the quadrature-phase error signal to drive the quadrature-phase fine tuning control. In an alternative embodiment, the stability of quadrature-phase can be enhanced without the output quadrature-phase detector by making the quadrature-phase fine tuning control dependent upon the amplitude-difference negative feedback error signal.

11 Claims, 8 Drawing Sheets

AUTOMATIC RC/CR QUADRATURE NETWORK

BACKGROUND OF THE INVENTION

1. Technical Field

The present invention relates generally to broadband phase shifting circuits for generating quadrature RF and microwave signals, and more particularly to a stabilized quadrature RC/CR phase shifting network.

2. Background Art

The majority of modern communications systems use complex modulation formats to improve spectral efficiency. Complex modulation entails modulating both of the available degrees of freedom of an electrical signal, namely amplitude and phase, to convey information. Although it is possible to modulate in a polar coordinate system ("polar modulation") with separate amplitude and phase modulators, the different circuit topologies import different signal dynamics, and modulation accuracy suffers.

It is more common and economical in practice to modulate within a rectangular coordinate system, meaning that the information is cast into real and imaginary parts instead of amplitude and phase. The prevalent lexicon is to replace "real" and "imaginary" with "I" (for "In-phase") and "Q" (for "Quadrature"), and the corresponding modulators are referred to as IQ modulators. An advantage of an IQ modulator over a polar modulator is that the I and Q information signal paths use identical circuitry, with identical dynamics and thus better modulation accuracy. This is in contrast to the separate AM and PM modulators of a polar modulator, comprising dramatically different types of circuits with different dynamics.

A quadrature phaseshifter operating at the "carrier" or "local oscillator" ("LO") frequencies is a required part of an IQ modulator, and in many other functional blocks in radios, especially modern radios using complex modulation and/or complex architectures. In these applications, especially ones using complex architectures, phaseshifter accuracy requirements are extreme for both matched amplitudes and exact quadrature-phase, typically amounting to tenth's of a percent and fractional degrees, respectively, and no IC process is capable of that level of performance. However, both errors can be compensated for in a calibration step, and the compensation is actually fairly easy. The hard part is holding the phaseshifter stable enough (both amplitude-difference and quadrature-phase) in between calibrations such that the compensations remain valid. Negative feedback is the answer, as might be expected.

Even so, errors still exist in IQ modulators. Errors may be classified as either linear errors or nonlinear errors. Linear errors are those that can be removed with a single correction value, independent of the information signal. The four linear errors of an IQ modulator are quadrature-phase error, gain ratio error, $I_{offset}$ error, and $Q_{offset}$ error. Nonlinear errors, on the other hand, are errors that are a function of the informational signal itself. As corrections to nonlinear errors are complicated, the nonlinear errors are simply best avoided by using standard design techniques.

FIG. 1 shows a very common prior art narrowband RC/CR phaseshifter circuit. The advantage of such an RC/CR phaseshifter is that outputs are in quadrature at all frequencies. The disadvantage is that amplitudes are equal at only one frequency and diverge elsewhere. It is a narrowband circuit.

Another prior art quadrature RC/CR phaseshift circuit is shown in U.S. Pat. No. 6,310,502, to Klier. The device taught in the '502 patent uses variable resistors and an output quadrature-phase detector feeding an error signal back to the variable resistor in the high pass branch. The low pass branch variable resistor is set to a fixed value per a frequency-to-voltage lookup table and DAC such that its cutoff frequency approximately equals the operating frequency. However, before any difference between cutoff and operating frequencies causes mismatched output amplitudes (as will happen in the circuit shown in Klier, and even worse, since one of the variable resistors is fixed), the quadrature output phase negative feedback will do nothing to aid in stabilizing output amplitude difference via the normal linkage between amplitude and phase in electrical circuits. The present inventor has demonstrated that maintaining equal amplitudes is just as important (if not more so) in maintaining quadrature phase.

Another quadrature phaseshift circuit is the prior art circuit of Magoon et al, shown in U.S. Pat. No. 6,658,066. Magoon et al append extra variable resistance elements at the outputs of RC/CR networks (both single-ended and differential) which are controlled by an output quadrature-phase detector in a negative feedback fashion to establish and maintain accurate quadrature-phase. Magoon et al do not however attend to establishing or maintaining equal output amplitudes. The method taught in Magoon et al is embodied within a VLSI IC that provides the overhead for frequent calibrations that compensate for drift or disturbance inputs.

U.S. Pat. Nos. 5,694,063 and 5,644,260, each to DaSilva (referred to collectively herein as "DaSilva") show a prior art solution to the divergent output amplitude problem. This solution uses a negative feedback circuit and is illustrated in FIG. 2. In this circuit, if the output amplitudes were to become unequal for any reason (perhaps due to a frequency change, or a "disturbance"), then the detected DC voltage difference is amplified and applied to the variable resistors in a negative feedback fashion to re-equalize the output amplitudes. Automatic amplitude equalization thus occurs over the entire tuning range of the phase shifter. Further, if R equals R and C equals C, output phase will also be in quadrature.

DaSilva includes $V_{offset}$ to fine-tune exact quadrature-phase to compensate for things that cause phase to deviate from quadrature such as parasitic elements and mismatches between components.

The problem with DaSilva is that in between calibrations quadrature phase is not directly controlled and is susceptible to disturbance inputs and drift.

The foregoing patents reflect the current state of the art of which the present inventor is aware. Reference to, and discussion of, these patents is intended to aid in discharging Applicant's acknowledged duty of candor in disclosing information that may be relevant to the examination of claims to the present invention. However, it is respectfully submitted that none of the above-indicated patents disclose, teach, suggest, show, or otherwise render obvious, either singly or when considered in combination, the invention described and claimed herein.

DISCLOSURE OF INVENTION

The present invention distinguishes over DaSilva, and improves on DaSilva, by providing a quadrature phase shifting network that uses offset biasing ($I_{offset}$) of postamplifiers following the phaseshifter to fine tune quadrature-phase. The present invention also uses an output quadrature-phase detector to completely stabilize quadrature-phase with negative feedback by using the quadrature-phase error signal to drive the quadrature-phase fine tuning control. Alternatively, stability of quadrature-phase can be enhanced without the output quadrature-phase detector by making the quadrature-phase fine tuning control (either $V_{offset}$ or $I_{offset}$) dependent upon (and a function of) DaSilva's amplitude-difference negative feedback error signal, taking advantage of the phase information inherently present in that error signal.

Accordingly, it is a first and principal object of the present invention to provide a quadrature phase shift circuit with an amplitude-difference negative feedback loop that stabilizes output amplitude difference. This includes a derivative benefit of stabilizing quadrature-phase to some degree, versus frequency and component-drift/disturbance-inputs.

It is another object of the present invention to provide a quadrature phase shift circuit where quadrature fine-tuning is achieved by differentially tuning post-amplifier bias.

Still another object of the present invention is to provide a method for enhancing the stability/desensitivity of quadrature-phase by making part of the quadrature-phase fine-tuning adjustment (either $V_{offset}$ or $I_{offset}$) a function of amplitude-difference feedback control voltage Ve.

Yet another object is to provide a quadrature phase shift circuit that can be used in an IQ modulator, an IQ demodulator, or an image-rejection mixer.

Other novel features which are characteristic of the invention, as to organization and method of operation, together with further objects and advantages thereof will be better understood from the following description considered in connection with the accompanying drawings, in which preferred embodiments of the invention are illustrated by way of example. It is to be expressly understood, however, that the drawings are for illustration and description only and are not intended as a definition of the limits of the invention. The various features of novelty which characterize the invention are pointed out with particularity in the claims annexed to and forming part of this disclosure. The invention resides not in any one of these features taken alone, but rather in the particular combination of all of its structures for the functions specified.

BRIEF DESCRIPTION OF THE DRAWINGS

The invention will be better understood and objects other than those set forth above will become apparent when consideration is given to the following detailed description thereof. Such description makes reference to the annexed drawings wherein.

BEST MODE FOR CARRYING OUT THE INVENTION

Preferred embodiments of the present invention will now be described with reference to stabilizing a quadrature RC/CR phase shifting network.

Figure 1A:
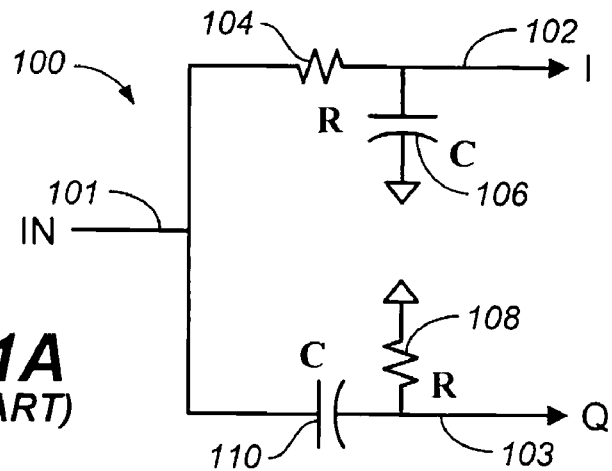
FIG. 1A is a schematic diagram showing a prior art RC/CR quadrature-phase network.

FIG. 1A shows a common prior art narrowband RC/CR phaseshifter circuit. The lagging-phase branch of the circuit includes series R 104 and shunt C 106. The leading-phase branch of the circuit includes series C 110 and shunt R 108. With matching resistors R and matching capacitors C, the describing equations are:

$$\frac{Output_{102}}{Input_{101}} = \frac{1}{j\omega R_{104}C_{106} + 1}$$

$$\frac{Output_{103}}{Input_{101}} = \frac{j\omega R_{108}C_{110}}{j\omega R_{108}C_{110} + 1}$$

Figure 1B:
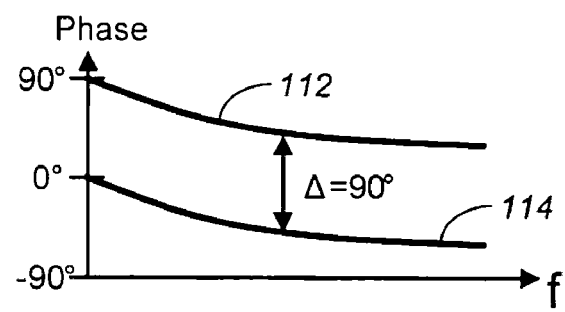
FIG. 1B is a graph showing that the output phases from swept frequency inputs are in quadrature at all frequencies.
Figure 1C:
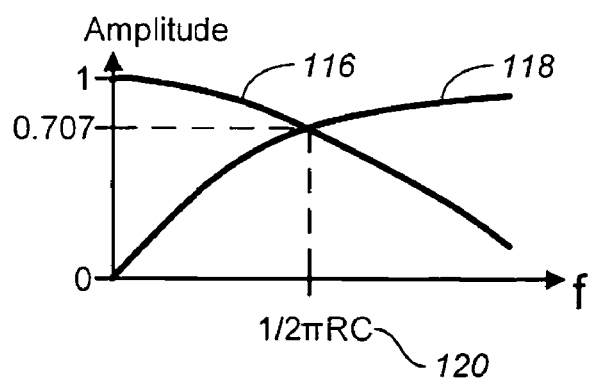
FIG. 1C is a graph showing that output amplitudes from swept frequency inputs are equal only at one frequency (the 1/RC pole frequency of the denominator) but diverge at all other frequencies.

Both equations have the same denominators but differ in their numerators. The "j" in the numerator of the second equation means that in response to a swept frequency input 101 the phases 114 and 112 of the two outputs 102 and 103, respectively, are fortuitously in quadrature at all frequencies as shown in FIG. 1B. The "w" in the numerator of the second equation means that in response to a swept frequency input 101 the amplitudes 116 and 118 are equal only at one frequency 120 (the 1/RC pole frequency of the denominator) but unfortunately diverge at all other frequencies as shown in FIG. 1C. These results are true independent of the loads on the outputs (contrary to commonly held belief) as long as the loads are equal, although a change of absolute output amplitudes and the pole frequency may occur, depending on the nature of the loads.

In as much as the quality of a complex signal or circuit is a function of the quality of both quadrature-phase and matched amplitudes, the mismatched amplitudes away from the pole frequency degrade system performance in broadband systems, and a solution is needed and desired.

Figure 2:
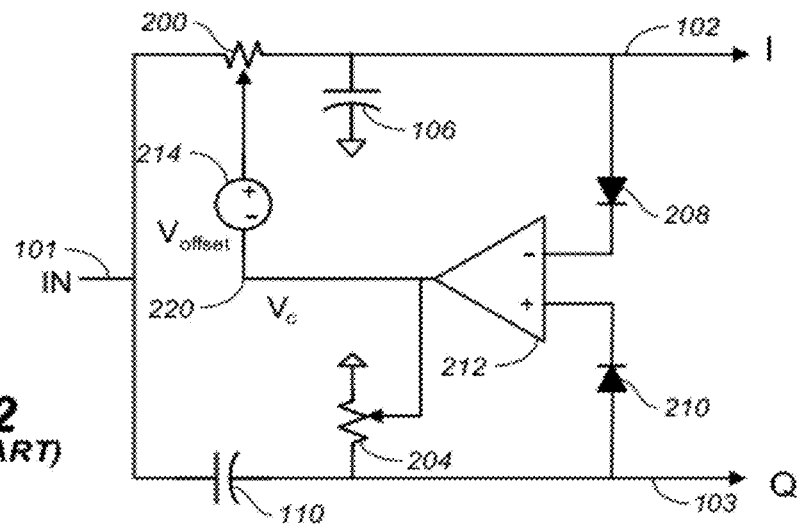
FIG. 2 shows the prior art quadrature phase shifting network of DaSilva using variable resistors and a negative feedback loop to maintain equal output amplitudes and $V_{offset}$ to fine-tune quadrature-phase.

FIG. 2 shows the prior art solution of DaSilva. The RC/CR network is broadbanded by replacing fixed resistors 104 and 108 with variable resistors 200 and 204 and adding amplitude detectors 208 and 210 and differential amplifier 212 in a negative feedback loop configuration to generate error signal $V_c$ 220 that controls the value of variable resistors 200 and 204. (The use of variable capacitors rather than variable R's may be more practical in microwave applications.) If the output amplitudes were to become unequal for any reason (perhaps due to an input frequency change or another disturbance), then the detected DC voltage difference is amplified and applied to the variable resistors in a negative feedback fashion to re-equalize the output amplitudes. DaSilva's feedback loop thus maintains equal amplitudes; more strictly, DaSilva desensitizes amplitude mismatch to forward path component variations. Automatic amplitude equalization thus occurs over the entire tuning range of the phase shifter and, when R 200 equals R 204 and C 106 equals C 110, output phase will also be in quadrature.

$V_{offset}$ 214 is made available to be adjusted at calibration intervals to fine-tune exact quadrature-phase to compensate for deviations from quadrature. Sources of such deviations include component mismatches, component drift, and/or the presence of parasitic elements, especially those associated with the variable resistors.

DaSilva's $V_{offset}$ 214 is a principal element of his inventive concept. However, it is greatly improved upon by the $I_{offset}$ utilized in the present invention. Further, the amplitude-difference feedback loop of DaSilva provides good stabilization of amplitude-difference and phase difference even without $V_{offset}$ 214. This is discussed more fully below.

Figure 3:
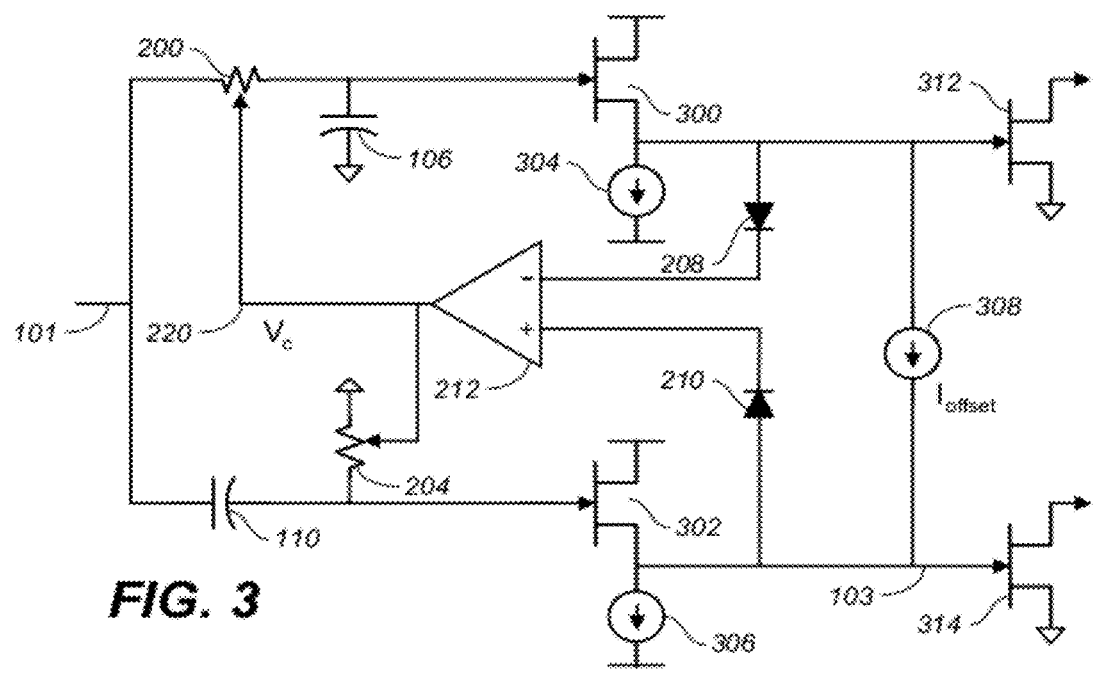
FIG. 3 shows a first preferred embodiment of the present invention, which improves on DaSilva by using $I_{offset}$ rather than $V_{offset}$.

The practical use of the quadrature phaseshifter of the present invention includes post amplifiers to prevent excessive loading by latter stages. FIG. 3 shows source-followers 300 and 302 and their associated DC bias current supplies 304 and 306 as post amplifiers as they embody the desireably high input impedance and low output impedance. FIG. 3 also includes a DC current source $I_{offset}$ 308 as a method to differentially offset the nominal DC bias currents of the source-follower transistors. Because the delay through a transistor changes as a function of its bias current (more bias current generally means less delay), $I_{offset}$ effectively varies the phase relationship at the source follower outputs and thus can be used as a fine quadrature-phase adjustment in much the same manner as $V_{offset}$. Transistors 312 and 314 constitute the typical source-follower loads. As will be appreciated, in the alternative $I_{offset}$ may be a different kind of controlled signal source, including a controlled voltage source. Additionally, post amplifiers 300 and 302 may be embodied in a number of suitable active devices, including common sources, common emitters, source followers, and emitter followers.

The source-follower transfer function equation is [Feucht]:

$$\frac{V_{out}}{V_{in}} = \frac{C_{GS}}{C_{GS}+C_L} \cdot \frac{s+\frac{g_m}{C_{GS}}}{s+\frac{g_m}{C_{GS}+C_L}} = \frac{s\frac{C_{gs}}{g_m}+1}{s\frac{C_{GS}+C_L}{g_m}+1}$$

where $g_m$ and $C_{GS}$ are source-follower parameters and $C_L$ is the source-follower load presented by transistors 312 and 314 [Feucht, *Handbook of Analog Circuit Design*, Academic Press, 1990]. $C_{GS}$ and $g_m$ track each other to a large degree (their ratio is the transition frequency $w_t$ of the transistor), and so the zero frequency is only a weak function of bias, especially when the transistor is operated in its high and nearly constant $f_t$ region, as is typical. The fixed $C_L$ however swamps out $C_{GS}$ to some degree and allows movement of the pole frequency by varying $g_m$ with source-follower bias current. With bias current, $g_m$ will generally increase, moving the pole frequency higher and reducing the time delay through the device. The poles of the two source-followers move in opposite directions as $I_{offset}$ differentially changes the source-follower bias currents.

Further reasons for preferring source-followers in a post-amplifier embodiment include the fact that they offer high variability of $g_m$ with little change in DC bias voltages, and they offer very high pole and zero frequencies because $g_m$ can be very high. Note that differences in small-signal amplitude created by $I_{offset}$ will be removed by DaSilva's amplitude-difference negative-feedback loop. Also, note that in narrower bandwidth applications more conventional common-source or differential pairs (with the other input grounded) can replace the source-follower and still retain the quadrature-phase fine-tuning via bias offsetting, albeit with more limited range of tuning.

Figure 4A:
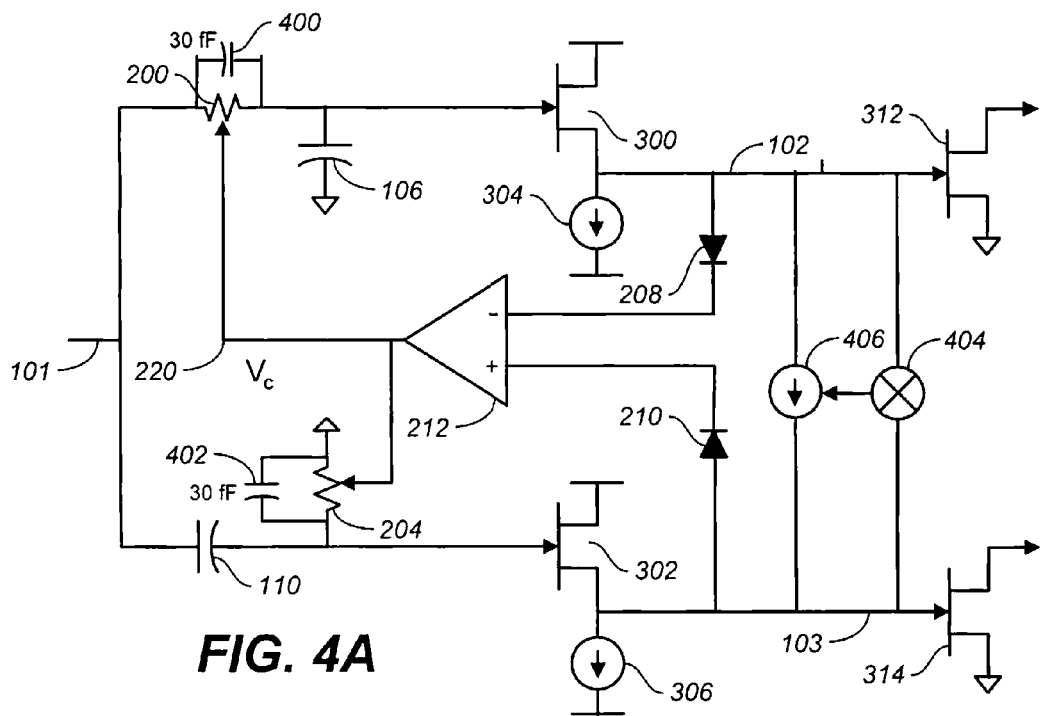
FIG. 4A is a circuit diagram showing an alternative embodiment of the present invention in which a quadrature-phase stabilizing circuit uses negative feedback where the error signal of an output quadrature-phase detector controls $I_{offset}$.

The effectiveness of source-followers and $I_{offset}$ in tuning quadrature-phase is demonstrated in a simulation using contemporary high frequency circuit models. The schematic for simulation is shown in FIG. 4A and includes 1 pF capacitors 202 and 206. Realistic 30 fF parasitic capacitors 400 and 402 bridge the variable resistors and guarantee deviation from quadrature-phase in the absence of compensation. An output quadrature phase detector 404 and negative feedback loop driving voltage-controlled current source 406 is included.

Figure 4B:
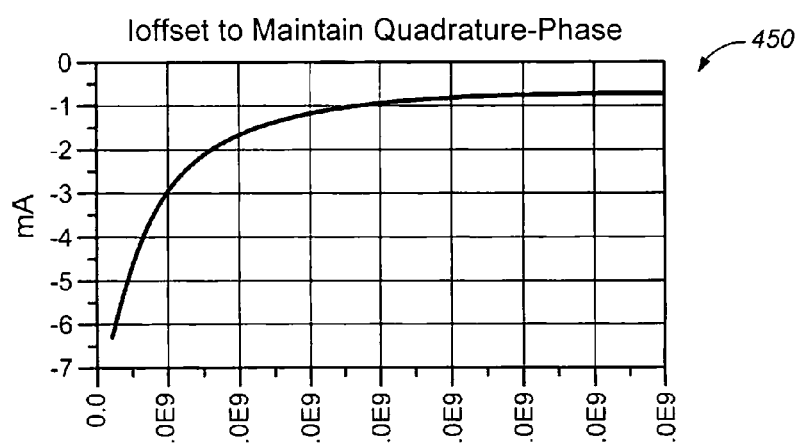
FIG. 4B is a graphs showing the $I_{offset}$ required to maintain quadrature-phase in relation to frequency.

A simulation was performed to ascertain the $I_{offset}$ required to establish and maintain quadrature-phase at nodes 102 and 103. The source-followers are nominally biased with 10 ma current sources 304 and 306. FIG. 4B is a graph 450 showing the required $I_{offset}$ current over five octaves of frequency. At higher frequencies just a small fractional offset to the source follower transistor bias current is needed to compensate for the 30 fF bridging capacitors. At lower frequencies $I_{offset}$ increases as the adverse effect of the 30 fF capacitors becomes more significant. The loop approaches loosing lock as frequency approaches 250 MHz but shows no limitation at higher frequencies.

Output Quadrature-phase Stabilization: In between calibrations, output phase might drift away from quadrature in response to a "disturbance input" and mismatched phase sensitivities. Examples of disturbance inputs include changes of temperature, signal level, and/or power supply voltage. Sources of mismatched phase sensitivities are numerous and complicated. Likely sources include: (1) mismatched component temperatures and temperature coefficients; (2) parasitic elements, most particularly the parasitic capacitance $C_{ds}$ bridging the variable resistors; (3) the inherently asymmetrical RC/CR phaseshifter layout; and (4) asymmetrical substrate temperature gradients.

One way to stabilize output quadrature-phase against disturbance inputs on a continuous basis (that is, in between calibrations) is the output quadrature-phase detector and negative feedback loop just described to demonstrate the effectiveness of $I_{offset}$. It can also drive DaSilva's $V_{offset}$.

Another approach does not use the output quadrature-phase detector. It is first noted that during the process of stabilizing amplitude-difference in between calibrations, DaSilva's feedback loop also provides some supplementary stabilization of quadrature-phase. This occurs because the amplitude and phase characteristics of electrical circuits are not independent, but rather are intimately related; any change in amplitude-difference automatically provides information about how phase has also changed. The linkage between circuit amplitude and phase depends on the characteristic equations of the particular networks, which in the case of RC/CR networks are particularly straightforward.

While DaSilva provides some degree of quadrature-phase stability, it will be shown next that additional quadrature-phase stability can be achieved by ensuring that part of $V_{offset}$ or $I_{offset}$ is a function of $V_c$.

Preliminarily, the term "DaSilva's $V_c$ is used hereinafter to mean only the amplitude-difference negative feedback control signal 220 of the DaSilva patent, independent of whether $V_{offset}$ or $I_{offset}$ is driven.

Referring again to FIG. 2, in the case of the DaSilva solution, the amplitude difference control signal $V_c$ 220 maintains output amplitudes 102 and 103 equal by driving variable resistors as previously described. $V_c$ naturally accommodates the attributes of the driven device such as (in the case of variable resistors implemented with $V_{DS}=0$ "cold" FETs) the cold FET's threshold voltage ("offset") and transconductance ("scaled") attributes. But supplementary use of $V_c$ to also drive other devices for quadrature-phase control, such as $V_{offset}$ or $I_{offset}$, will entail the use of different offset and scaling parameters in general. And because of the complexities of the transfer functions in general, proper offset and scaling values would be determined empirically in practice, in the simulator for design centering, and by measurements in production.

Figure 5A:
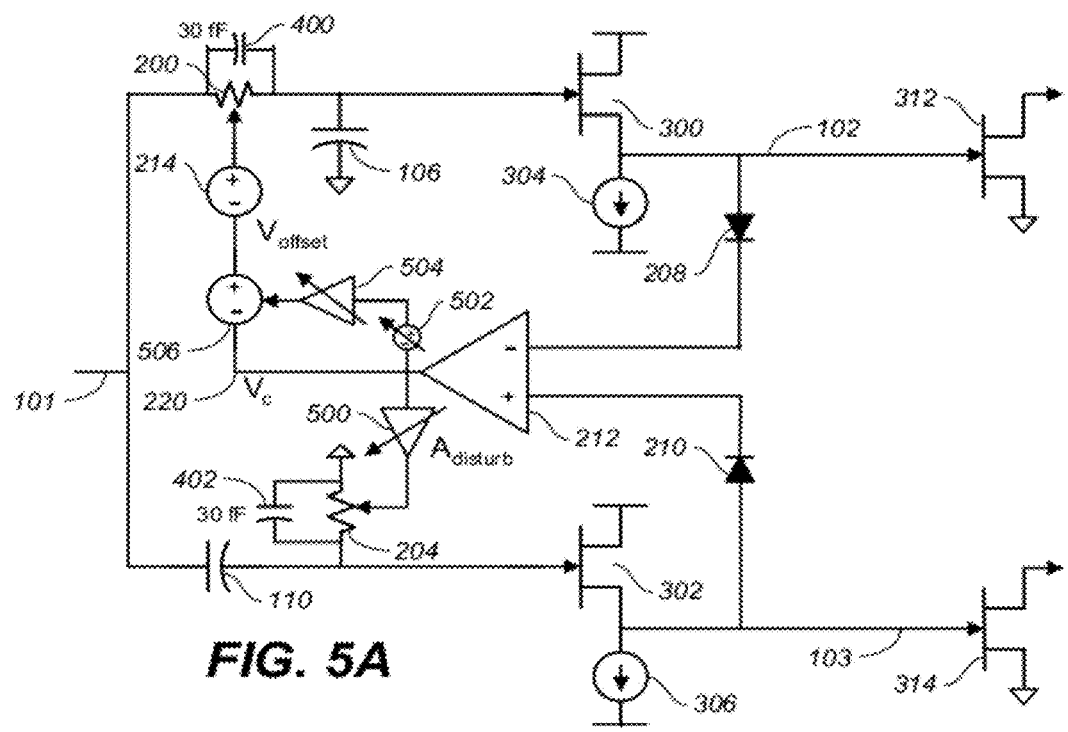
FIG. 5A is a circuit diagram of an alternative embodiment of the present invention showing $A_{disturb}$, a hypothetical source of quadrature-phase drift in between calibrations, and a quadrature-phase stabilizing circuit wherein an offset-and-scaled $V_e$ modifies $V_{offset}$.

The schematic of FIG. 5A is used to demonstrate that a voltage dependent voltage source 506 responsive to $V_c$ 220 is indeed effective in maintaining quadrature-phase. The 30 fF parasitic capacitors 400 and 402 are retained and a disturbance input $A_{disturb}$ 500 has been added and is varied ±1% (from 0.99 to 1.01) to emulate the effects of a drift in the lower variable resistor's cold bias transconductance (deemed the most likely source of drift within the overall system given their fine geometries and the inherent asymmetry of the phaseshifter layout.) Voltage source 502 and amplifier 504 provide the appropriate offset and scaling to $V_c$ 220 to drive the voltage-dependent voltage source 506. 502 and 504 are empirically adjusted for best quadrature-phase stability. The transistor models are those of a modern 50 GHz $f_t$ GaAs pHEMT IC process. The simulation frequency is 2 GHz, all FETs are nominally biased at 10 ma each, and an output quadrature-phase calibration already performed requiring a $V_{offset}$ 214 value of −76 mV.

Figure 5B:
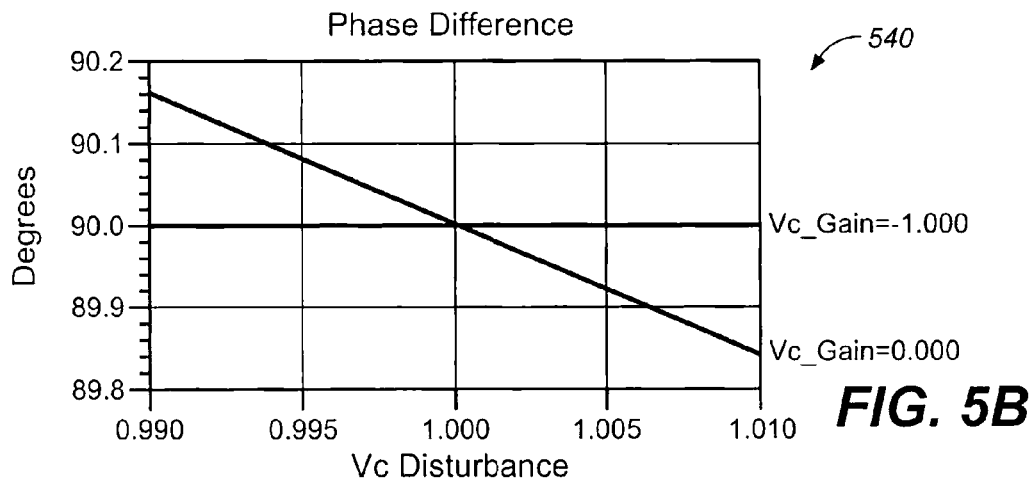
FIGS. 5B and 5C are graphs showing how post-calibration output phase responds to $A_{disturb}$ with and without the stabilizing effect of the voltage source, and that output quadrature-phase is in fact stabilized.
Figure 5C:
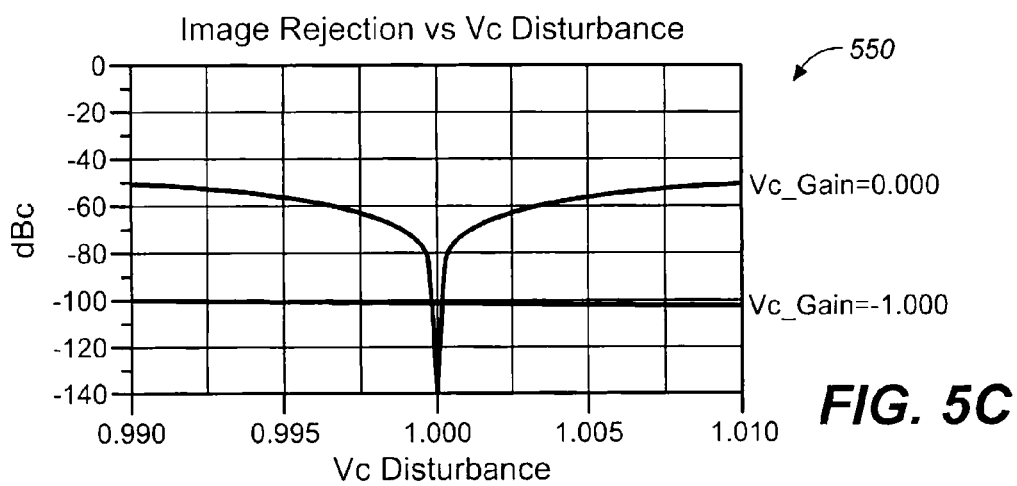

FIGS. 5B and 5C are graphs 540, 550, respectively, showing how post-calibration output phase responds to $A_{disturb}$ 500 with and without the stabilizing influence of the voltage source 506, and show that output quadrature-phase is indeed stabilized. Quadrature-phase error is presented in both linear format and equivalent image frequency rejection in dB—the latter figure of merit is useful when the linear quadrature-phase error numbers become very small and is also a commonly used figure of merit in actual radios (a very high amplitude-difference loop gain maintains essentially perfectly matched output amplitudes, so any image frequency energy is due to exclusively to quadrature-phase error.) The solution required a voltage 502 of +0.76V (to negate $V_c$) and a gain 504 of −1.00 (as it must be since it merely negates the effects of hypothesized disturbance $A_{disturb}$). Note that a residual $V_{offset}$ 214 misalignment is purposefully retained to keep the image energy from disappearing off the bottom of graph 5C.

Figure 6A:
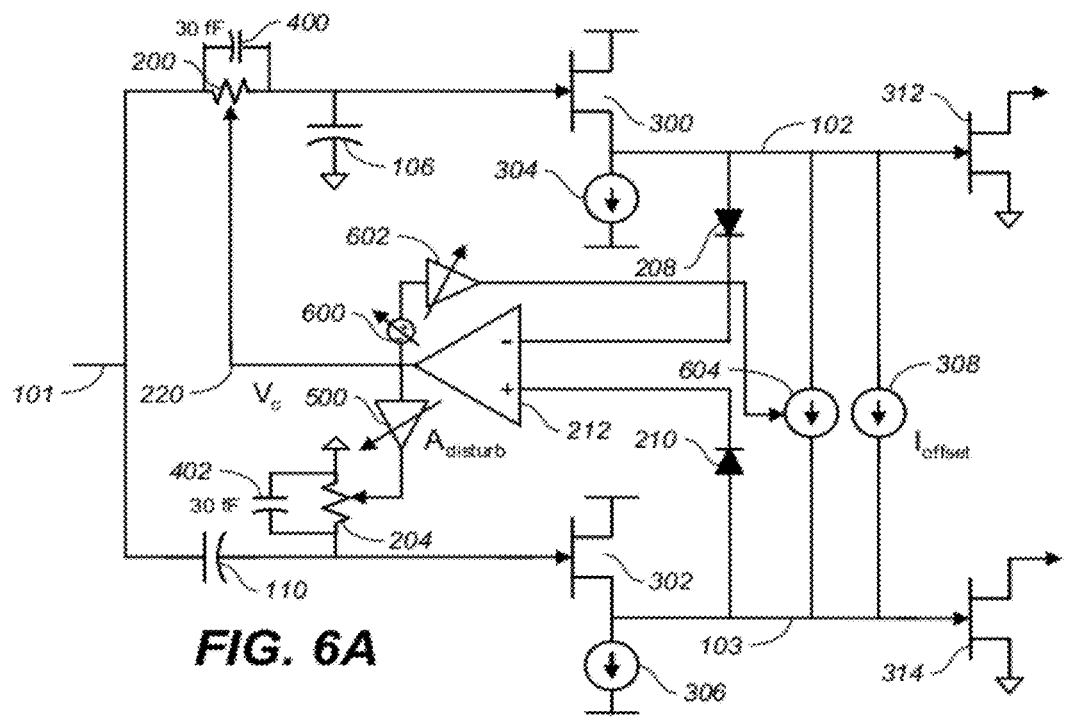
FIG. 6A is a circuit diagram of another preferred embodiment of the present invention, again showing $A_{disturb}$ and a quadrature-phase stabilizing circuit wherein a offset-and-scaled $V_e$ modifies $I_{offset}$.

The schematic circuit diagram of FIG. 6A demonstrates that a voltage dependent current source 604 responsive to $V_c$ 220 is indeed effective in maintaining quadrature-phase. The 30 fF parasitic capacitors 400 and 402 and disturbance input $A_{disturb}$ 500 varied ±1% (from 0.99 to 1.01) are retained. Voltage source 600 and amplifier 602 provide the appropriate offset and scaling to $V_c$ 220 to drive the voltage-dependent current source 604. 600 and 602 are empirically adjusted for best quadrature-phase stability. All other parameters are the same as in FIG. 5A and an output quadrature-phase calibration already performed requiring an $I_{offset}$ 308 value of 1.68 ma.

Figure 6B:
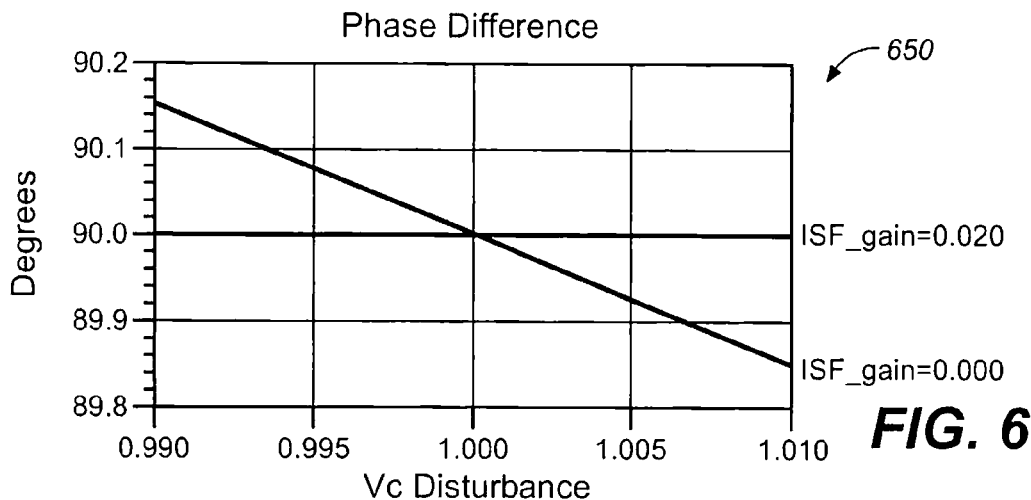
FIGS. 6B and 6C are graphs showing the deviation from quadrature phase in response to disturbance input $A_{disturb}$ with and without negative feedback to $I_{offset}$.
Figure 6C:
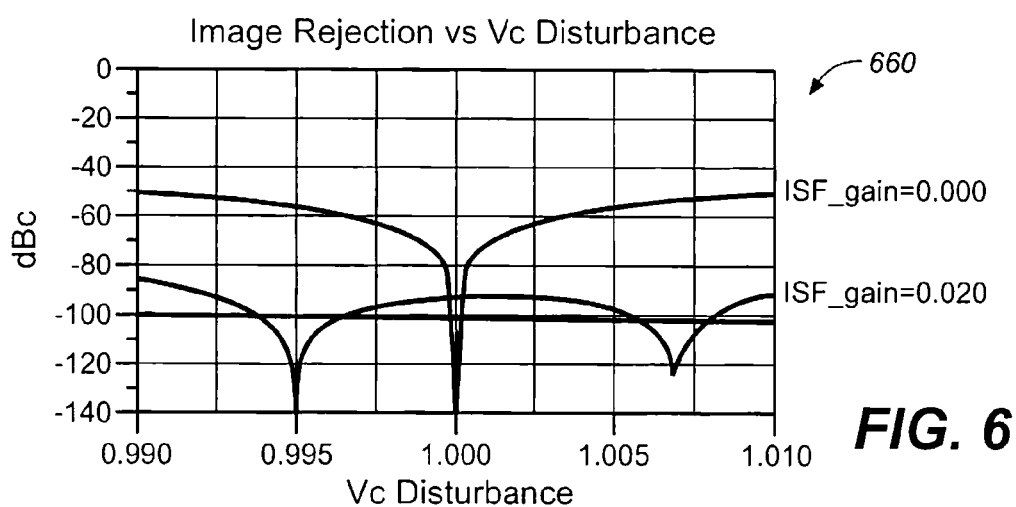

FIG. 6B is a graph 650 showing how post-calibration output phase responds to $A_{disturb}$ 500 with and without the stabilizing influence of the current source 604, and shows that output quadrature-phase stability is indeed improved. Referring again to FIG. 6A, the solution required a voltage 600 of +0.76V and a gain 602 of 0.0204 S. The two image rejection nulls in the graph 660 of FIG. 6C demonstrate the presence of higher-degree nonlinearities within this particular transfer function. A higher-degree nonlinear scaling function 602 could be used further flatten the stabilization, depending on the goals, the disturbance mechanism, and noise levels during adjustments.

Figure 7A:
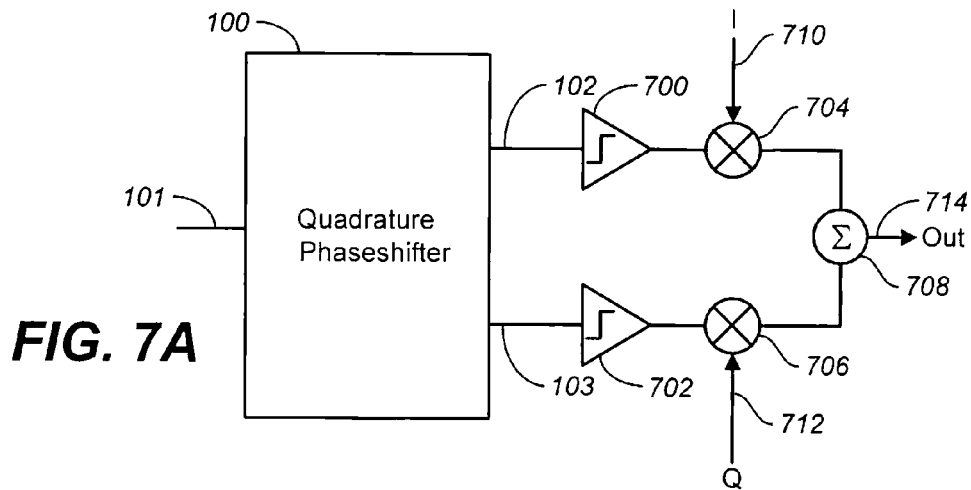
FIG. 7A is a circuit diagram showing the inventive quadrature phaseshifter incorporated in an IQ modulator.

FIG. 7A is a schematic diagram showing the inventive quadrature phaseshifter incorporated in an IQ modulator. An IQ modulator upconverts two independent baseband signals to form a complex modulated RF signal. A periodic signal 101 is applied to quadrature phaseshifter input 100. Output 101 is amplified and limited by limiting amplifier 700 then applied to mixer 704. Quadrature-phase output 102 is amplified and limited by limiting amplifier 702 then applied to mixer 706. Baseband signals I 710 and Q 712 baseband signals are upconverted by mixers 704 and 706, respectively, and then summed in power combiner 708 to produce a complex-modulated RF output 714.

Figure 7B:
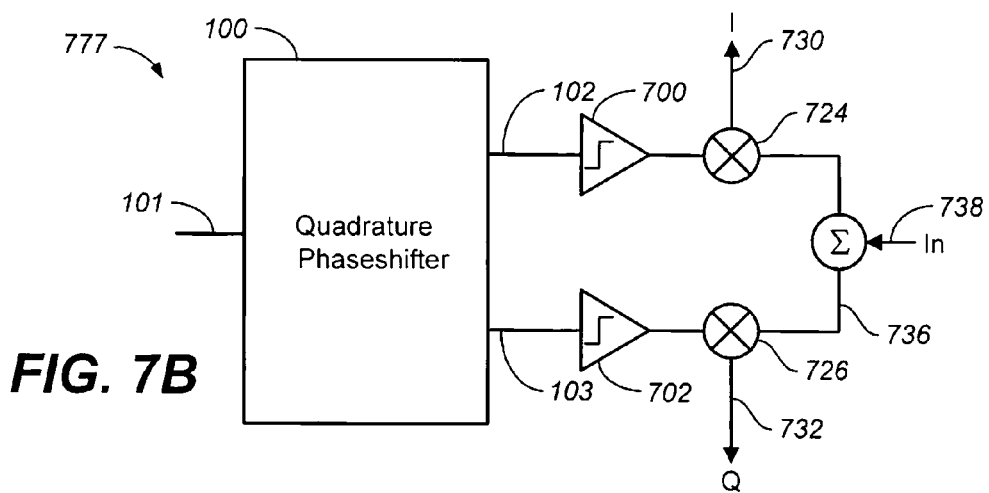
FIG. 7B is a circuit diagram showing the inventive quadrature phaseshifter incorporated in an IQ demodulator.

FIG. 7B is a schematic diagram showing the inventive quadrature phaseshifter incorporated in an IQ demodulator. An IQ demodulator is the reciprocal of an IQ modulator in that it downconverts a complex modulated RF signal into two independent baseband signals. A periodic signal 101 is applied to quadrature phaseshifter input 100. Output 101 is amplified and limited by limiting amplifier 700 then applied to mixer 724. Quadrature-phase output 102 is amplified and limited by limiting amplifier 702 then applied to mixer 726. A complex modulated RF signal 734 is applied to power splitter 728, creating in-phase RF signals 734 and 736. RF signal 734 applied to mixer 724 to create I baseband output 730. RF signal 736 applied to mixer 726 to create I baseband output 732.

Figure 7C:
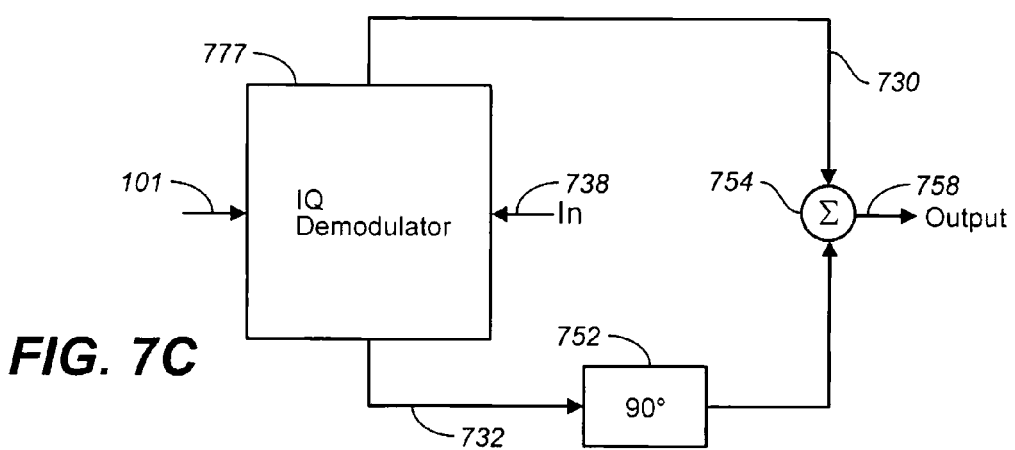
FIG. 7C is a circuit diagram showing the inventive quadrature phaseshifter incorporated in an image rejection mixer.

FIG. 7C is a schematic diagram showing the inventive quadrature phaseshifter incorporated in an image rejection mixer. An image rejection mixer frequency converts between non-baseband frequencies while rejecting the image-frequency energy normally associated with such an operation. An image rejection mixer is an IQ demodulator 777 with one output (732 in this case) passing through a added 90 degree phaseshifter 752 before summation with the other output 730 using summer 754. The result is frequency conversion of the desired energy and rejection of the undesired image energy at the final output 758.

The foregoing disclosure is sufficient to enable those with skill in the relevant art to practice the invention without undue experimentation. The disclosure further provides the best mode of practicing the invention now contemplated by the inventor.

While the particular circuits shown and disclosed in detail are fully capable of attaining the objects and providing the advantages stated herein, it is to be understood that they are merely illustrative of the presently preferred embodiments of the invention and that no limitations are intended concerning the detail of the design shown other than as defined in the appended claims. Accordingly, the proper scope of the present invention should be determined only by the broadest interpretation of the appended claims so as to encompass

What is claimed as invention is:

1. A phase shift circuit comprising:
a first phase shifter receiving an input signal to be phase shifted, the output of said first phase shifter being a first output signal that is a phase-shifted version of said input signal, said first output signal having an amplitude that is a function of the phase difference between said input signal and said first output signal, said first phase shifter having a first amplitude correction input that receives a first output amplitude correction voltage to which said first phase shifter is responsive by varying the amplitude of said first output signal, said first output signal being coupled to the signal input of a first control signal controlled phase shifter, said first control signal controlled phase shifter having a first final output, said first final output generating a first phase-adjusted final output signal that is a phase-shifted version of said first output signal, said first control signal controlled phase shifter also having a first control signal input for receiving a first control signal to which said first control signal controlled phase shifter is responsive by varying the phase shift between said first output signal and said first phase-adjusted final output signal;
a second phase shifter receiving said input signal to be phase shifted, the output of said second phase shifter being a second output signal that is a phase-shifted version of said input signal, said second output signal having an amplitude that is a function of the phase difference between said input signal and said second output signal, said second phase shifter having a second amplitude correction input that receives said first output amplitude correction voltage to which said second phase shifter is responsive by varying the amplitude of said second output signal, said second output signal being coupled to the signal input of a second control signal controlled phase shifter, said second control signal controlled phase shifter having a second final output, said second final output generating a second phase-adjusted final output signal that is a phase-shifted version of said second output signal, said second control signal controlled phase shifter also having a second control signal input for receiving said first control signal to which said second control signal controlled phase shifter is responsive by varying the phase shift between said second output signal and said second phase-adjusted final output signal;
a first amplitude detector receiving said first phase-adjusted final output signal, having a first detected output that is a function of the amplitude of said first phase-adjusted final output signal;
a second amplitude detector receiving said second phase-adjusted final output signal, having a second detected output that is a function of the amplitude of said second phase-adjusted final output signal;
a differential amplifier having a first amplifier input receiving said first detected output, and a second amplifier input receiving said second detected output, said differential amplifier producing said output amplitude correction voltage as a function of the difference between the amplitude of said first phase-adjusted final output signal and the amplitude of said second phase-adjusted final output signal, said output amplitude correction voltage being applied in parallel to said first amplitude correction input of said first phase shifter and said second amplitude correction input of said second phase shifter, thereby providing a negative feedback that keeps the amplitude of said first phase-adjusted final output signal equal to said second phase-adjusted final output signal;
control means for receiving said output amplitude correction voltage from the output of said differential amplifier and generating a controlled output signal that is a function of the difference between the phase of said first phase-adjusted final output signal and the phase of said second phase-adjusted final output signal; and
a controlled variable signal source in parallel communication with, and providing said first control signal to, said first control signal input of said first control signal controlled phase shifter and said second control signal input of said second control signal controlled phase shifter, said variable signal source having a signal control input that receives said adapted output signal from said adaptive means;
wherein said variable signal source is responsive to said controlled output signal from said control means by varying said first control signal at said first control signal input of said first control signal controlled phase shifter and said second control signal input of said second control signal controlled phase shifter, adjusting the phases of the signals passing through said first control signal controlled phase shifter and said second control signal controlled phase shifter, thereby maintaining a fixed shift between the phase of said first phase-adjusted final output signal and the phase of said second phase-adjusted final output signal.

2. The phase shift circuit of claim 1, wherein said offset constant-value signal source is a constant-value current source, and wherein said first and second control signal controlled phase shifters are current-controlled phase shifters.

3. The phase shift circuit of claim 2, wherein said first and second current-controlled phase shifters are active devices with an associated bias current source and are selected from the group consisting of common source, common emitter, source follower, and emitter follower.

4. The phase shift circuit of claim 1, wherein said offset control signal source is a constant-value voltage source.

5. The phase shift circuit of claim 4, wherein said first and second voltage-controlled phase shifters are active devices with an associated bias voltage source and are selected from the group consisting of common source, common emitter, source follower, and emitter follower.

6. The phase shift circuit of claim 1, further including a first load element for receiving said first phase adjusted final output and a second load element for receiving said second phase adjusted final output.

7. The phase shift circuit of claim 6, wherein said first and second load elements are transistor amplifiers.

8. The phase shift circuit of claim 6, wherein said first and second load elements are selected from the group consisting of common source, common emitter, source follower, and emitter follower.

9. A phase shift circuit for generating a phase stabilization signal derived from an amplitude control signal, said phase shift circuit comprising:
a phase shifter having a signal input for receiving an input signal and generating a first output signal and a second output signal, wherein the amplitude of said first output signal and said second output signal are to be equal and the phase difference between said first output signal and said second output signal is to be at a fixed difference, an amplitude control input receiving the amplitude control signal and a phase control input receiving a phase stabilization signal, the output amplitude difference between said first output signal and said second output signal being responsive to said amplitude control signal and the output phase difference between said first output signal and said second output signal being responsive to said phase stabilization signal;

a first amplitude detector receiving said first output signal, having a first detected output that is a function of the amplitude of said first output signal;

a second amplitude detector receiving said second output signal, having a second detected output that is a function of the amplitude of said second output signal;

a differential amplifier having a first amplifier input receiving said first detected output, and a second amplifier input receiving said second detected output, said differential amplifier producing said amplitude control signal as a function of the difference between the amplitude of said first output signal and the amplitude of said second output signal, said amplitude control signal thereby providing a negative feedback that controls the difference in the amplitude of said first output signal and the amplitude of said second output signal; and a phase stabilizer that receives said amplitude control signal and generates the phase stabilization signal applied to said phase control input thereby providing stabilization to the phase difference between said first output signal and said second output signal;

wherein the output amplitudes are controlled to be equal and the output phases are stabilized at a fixed difference.

10. The phase shift circuit of claim 9, wherein said phase stabilizer includes offset and scaling that establishes the deterministic functional relationship between the amplitude control signal and the phase stabilization signal to compensate for changes in phase difference that may occur due to the presence of circuit parasitic elements and in the presence of disturbance inputs.

11. The phase shift circuit of claim 10, wherein said scaling uses linear and nonlinear functions.

* * * * *